(12) United States Patent
Tsukuda

(10) Patent No.: US 11,187,899 B2
(45) Date of Patent: Nov. 30, 2021

(54) LIGHT SOURCE DEVICE, OPTICAL SCANNER, DISPLAY SYSTEM, AND MOBILE OBJECT

(71) Applicant: Tomoyuki Tsukuda, Kanagawa (JP)

(72) Inventor: Tomoyuki Tsukuda, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/851,123

(22) Filed: Apr. 17, 2020

(65) Prior Publication Data

US 2020/0355915 A1 Nov. 12, 2020

(30) Foreign Application Priority Data

May 8, 2019 (JP) .............................. JP2019-087993

(51) Int. Cl.
*G09G 5/00* (2006.01)
*G02B 27/01* (2006.01)
*B60K 35/00* (2006.01)
*G02B 26/10* (2006.01)
*G09G 5/36* (2006.01)

(52) U.S. Cl.
CPC .......... *G02B 27/0101* (2013.01); *B60K 35/00* (2013.01); *G02B 26/101* (2013.01); *G09G 5/36* (2013.01); *B60K 2370/1529* (2019.05); *B60K 2370/23* (2019.05); *B60K 2370/31* (2019.05); *B60K 2370/333* (2019.05); *B60K 2370/334* (2019.05); *B60K 2370/42* (2019.05); *B60K 2370/48* (2019.05); *B60K 2370/785* (2019.05); *G02B 2027/0112* (2013.01); *G02B 2027/0118* (2013.01); *G09G 2354/00* (2013.01)

(58) Field of Classification Search
USPC .......... 345/7, 204, 8, 207; 372/38.01, 38.02; 701/532; 355/53; 250/208
See application file for complete search history.

(56) References Cited

U.S. PATENT DOCUMENTS

| 2002/0012109 A1* | 1/2002 | Suzuki | G03F 7/70258 355/53 |
| 2003/0219049 A1* | 11/2003 | Suda | H01S 5/042 372/38.01 |
| 2007/0086495 A1* | 4/2007 | Sprague | H01S 5/06804 372/38.02 |
| 2009/0005961 A1* | 1/2009 | Grabowski | G02B 27/01 701/532 |

(Continued)

FOREIGN PATENT DOCUMENTS

| CN | 104685403 A | 6/2015 |
| CN | 107045200 A | 8/2017 |

(Continued)

OTHER PUBLICATIONS

Extended European Search Report dated Oct. 5, 2020 in European Patent Application No. 20169531.9, 11 pages.

(Continued)

*Primary Examiner* — Thuy N Pardo
(74) *Attorney, Agent, or Firm* — Xsensus LLP

(57) ABSTRACT

A light source device includes a plurality of light sources configured to output a plurality of laser beams of different color components; and circuitry. A ratio in maximum output power between the plurality of laser beams output from the plurality of light sources is variable.

9 Claims, 10 Drawing Sheets

(56) References Cited

U.S. PATENT DOCUMENTS

| | | | |
|---|---|---|---|
| 2011/0122101 A1* | 5/2011 | Kurozuka | G02B 27/0101 345/204 |
| 2012/0112038 A1* | 5/2012 | Hamoir | H04N 5/2256 250/208.1 |
| 2013/0207950 A1 | 8/2013 | Haruna et al. | |
| 2015/0260984 A1 | 9/2015 | Yamakawa et al. | |
| 2017/0001459 A1* | 1/2017 | Uehira | B41J 2/475 |
| 2017/0276546 A1* | 9/2017 | Sakai | G01J 3/10 |
| 2018/0067308 A1* | 3/2018 | Sakai | H04N 9/3129 |
| 2018/0186082 A1* | 7/2018 | Randhawa | B23K 26/125 |
| 2018/0290476 A1* | 10/2018 | Uehira | B41J 2/475 |
| 2019/0018239 A1 | 1/2019 | Kurozuka et al. | |
| 2019/0097396 A1 | 3/2019 | Sakai et al. | |
| 2019/0310462 A1* | 10/2019 | Yoshimura | G02B 26/0833 |
| 2020/0089319 A1* | 3/2020 | Popovich | G06F 3/013 |

FOREIGN PATENT DOCUMENTS

| | | |
|---|---|---|
| CN | 107113410 A | 8/2017 |
| EP | 2 784 458 A1 | 10/2014 |
| JP | 2014-021227 | 2/2014 |
| JP | 2014-021235 | 2/2014 |
| JP | 2014-186078 | 10/2014 |
| JP | 2017-010057 | 1/2017 |
| JP | 2017-097153 | 6/2017 |
| JP | 2017-106977 | 6/2017 |
| JP | 2017-199710 | 11/2017 |

OTHER PUBLICATIONS

Office Action dated May 19, 2021 in Chinese Patent Application No. 202010325680.X, 5 pages.

* cited by examiner

CHANGES IN MAXIMUM LIGHT OUTPUT POWER WITH TEMPERATURE

FIG. 13

| TEMPERATURE (°C) | -40 | -35 | -30 | -25 | -20 | -15 | -10 | -5 | 0 | 5 | 10 | 15 | 20 | 25 | 30 | 35 | 40 | 45 | 50 | 55 | 60 | 65 | 70 | 75 | 80 | 85 | 90 | 95 | 100 | 105 |
|---|---|---|---|---|---|---|---|---|---|---|---|---|---|---|---|---|---|---|---|---|---|---|---|---|---|---|---|---|---|---|
| MAXIMUM LIGHT OUTPUT POWER R (mw) | 100 | 100 | 100 | 150 | 150 | 150 | 150 | 150 | 150 | 150 | 150 | 150 | 200 | 200 | 200 | 200 | 200 | 200 | 150 | 150 | 150 | 150 | 150 | 150 | 150 | 150 | 100 | 100 | 100 | 100 |
| MAXIMUM LIGHT OUTPUT POWER G (mw) | 50 | 50 | 50 | 50 | 50 | 80 | 80 | 80 | 80 | 80 | 100 | 100 | 100 | 100 | 100 | 100 | 100 | 100 | 100 | 100 | 80 | 80 | 80 | 80 | 60 | 60 | 60 | 60 | 60 | 60 |
| MAXIMUM LIGHT OUTPUT POWER B (mw) | 60 | 60 | 60 | 90 | 90 | 90 | 90 | 90 | 100 | 100 | 100 | 100 | 100 | 100 | 100 | 100 | 100 | 100 | 100 | 100 | 100 | 100 | 100 | 100 | 100 | 100 | 70 | 70 | 70 | 50 |

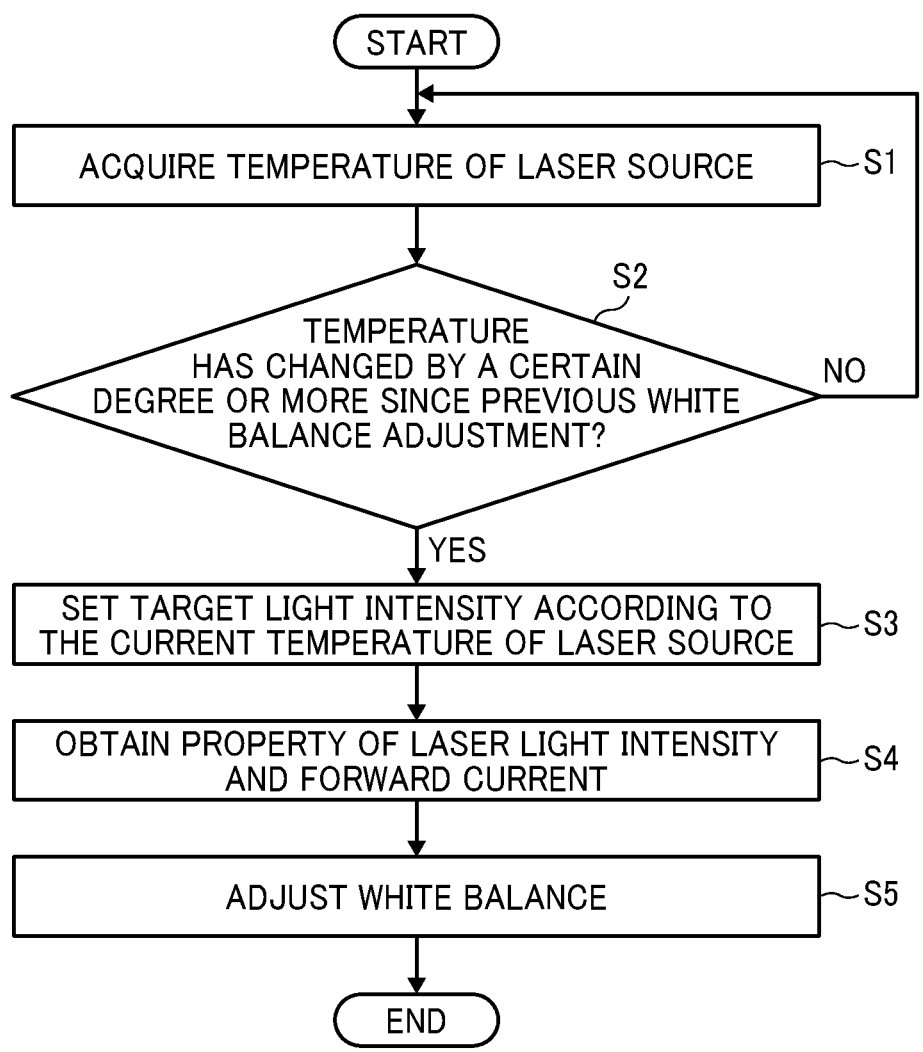

LIGHT SOURCE DEVICE, OPTICAL SCANNER, DISPLAY SYSTEM, AND MOBILE OBJECT

CROSS-REFERENCE TO RELATED APPLICATIONS

This patent application is based on and claims priority pursuant to 35 U.S.C. § 119(a) to Japanese Patent Application No. 2019-087993, filed on May 8, 2019, in the Japan Patent Office, the entire disclosure of which is hereby incorporated by reference herein.

BACKGROUND

Technical Field

The present disclosure relates to a light source device, an optical scanner incorporating the light source device, a display system incorporating the optical scanner, and a mobile object incorporating the display system.

Background Art

An image display device capable of reducing a change in the white balance with the temperature is known.

Further, a projector provided with a plurality of laser sources is also known that a laser source whose output power is smallest in the white balance ratio between the plurality of laser sources is pulse-driven. With such a projector, the restriction on the dimmable range can be relaxed even when the plurality of laser sources of different color components is used.

SUMMARY

In one aspect of this disclosure, there is provided an improved light source device including a plurality of light sources configured to output a plurality of laser beams of different color components; and circuitry. A ratio in maximum output power between the plurality of laser beams output from the plurality of light sources is vanable.

In another aspect of this disclosure, there is provided an improved optical scanner including the above-described light source device and a light deflector. The light deflector is configured to deflect light emitted from the light source device to scan in a first scanning direction and a second scanning direction orthogonal to the first scanning direction.

Further described is a display system including the above-described optical scanner, an image forming optical system, and a reflector. The image forming optical system is configured to reflect the light projected from the screen toward the reflector. The reflector is configured to reflect the light reflected by the image forming optical system so as to form a virtual image.

Still further described is a mobile object comprising the above-described display system. The reflector is a windshield.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein:

FIG. 13 is a table representing the maximum output values of laser beams with respect to the temperature, which are stored in a nonvolatile memory; and FIG. 14 is a flowchart for describing a process of controlling the output power of the laser beams.

Figure 1:
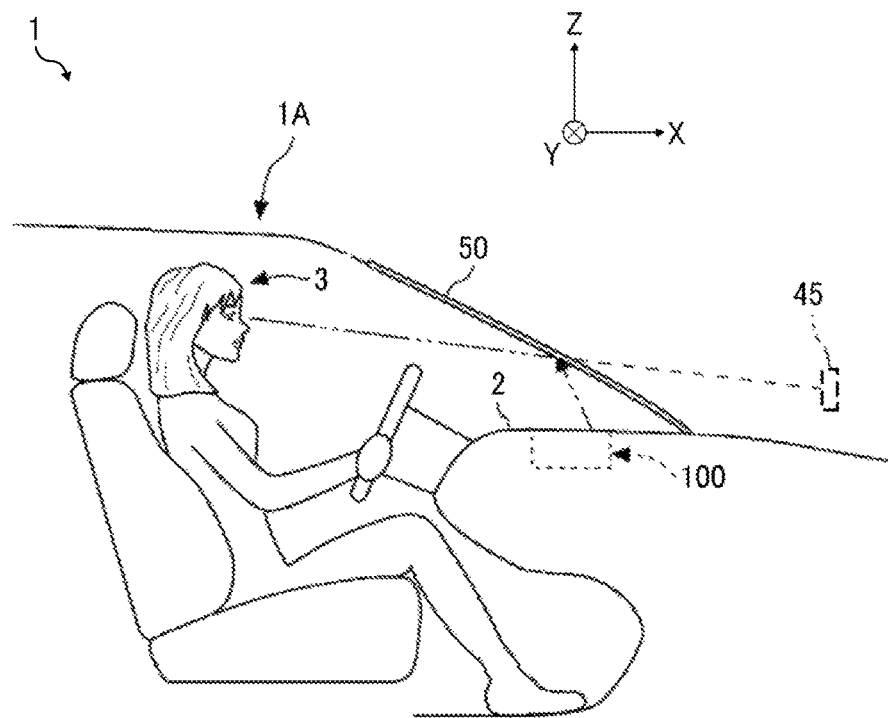
FIG. 1 is an illustration of an example of a system configuration of a display system according to an embodiment.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Embodiments of the present disclosure are described with reference to the drawings. In the description of the drawings, the same elements are denoted by the same reference numerals, and redundant description is omitted.

FIG. 1 is an illustration of an example of a system configuration of a display system 1 according to an embodiment.

In the display system 1, an observer 3 can visually identify a display image as the projection light projected from an on-board apparatus 100 (an example of a projection apparatus) is projected onto a transmissive reflector. The display image is image superimposed on the viewing field of the observer 3 as a virtual image 45. The display system 1 is included in, for example, a mobile object as a vehicle, an aircraft, or a ship; or an immobile object such as a driving simulation system or a home theater system. In the embodiment, a case where the display system 1 is included in an automobile serving as an example of a mobile object 1A is described. However, no limitation is intended thereby, and the type of usage of the display system 1 is not limited to the present embodiment.

Hereafter, coordinate axes are defined such that X denotes a travel direction of the mobile object 1A, Y denotes right and left directions, and Z denotes up-and-down directions.

The display system 1 enables the observer 3 (a driver) to visually recognize, through a windshield 50, for example, navigation information required for driving a vehicle (information, such as the speed of the vehicle, route information, the distance to a destination, the name of the current location, the presence and position of an object ahead of the vehicle, traffic signs indicating, for example, speed limit, and traffic jam information). In this case, the windshield 50 functions as a transmissive reflector that transmits a portion of incident light and reflects at least a portion of the residual portion of the incident light. The distance between the location of the eyepoint of the observer 3 and the front windshield 50 is about several tens of centimeters (cm) to one meter (m). Instead of the windshield 50, a combiner that is made of a transparent small plastic disk or the like may be used as a transmissive reflector.

The on-board apparatus 100 is, for example, a head-up display device (a HUD device). The on-board apparatus 100 may be disposed at any position in accordance with the interior design of the automobile. For example, the on-board apparatus 100 may be disposed below a dashboard 2 of the automobile or may be embedded in the dashboard 2. In the embodiment, a case where the on-board apparatus 100 is mounted in the dashboard 2 is described.

Figure 2:
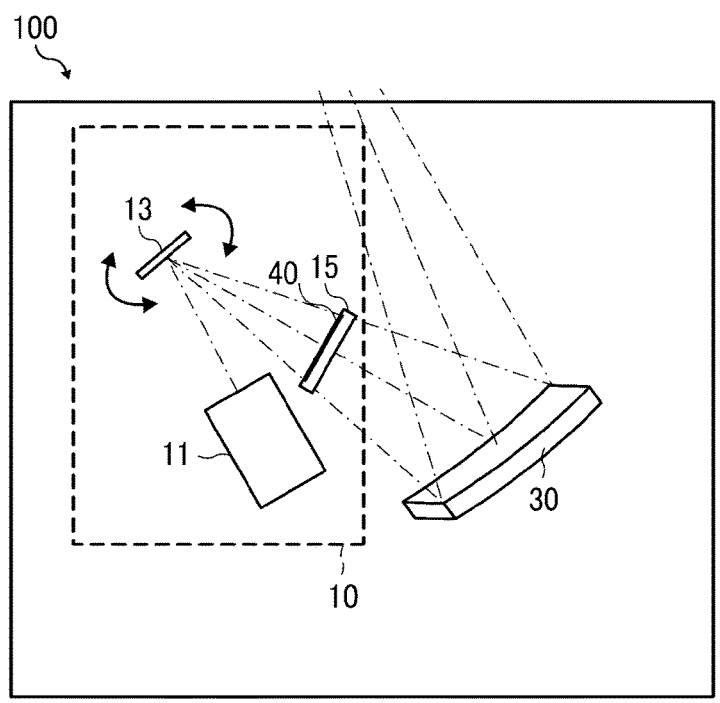
FIG. 2 is an illustration of an example of a configuration of a mounted apparatus according to the embodiment.

FIG. 2 is an illustration of an example of the configuration of the on-board apparatus 100 according to an embodiment. The on-board apparatus 100 includes a display device 10, which is an example of an optical scanner, and a free-form surface mirror 30.

The display device 10 includes a light source device 11, a light deflecting device (a light deflector) 13, and a screen 15. The light source device 11 emits a laser beam, which is emitted from a light source (a laser diode (LD) 1007), to the outside of the light source device 11. The light source device 11 may emit, for example, a laser beam in which laser beams of three colors including red (R), green (G), and blue (B) are combined. The laser beam emitted from the light source device 11 is guided to a reflecting surface of the light deflector 13. The light source device 11 includes, as a light source, a semiconductor light emitting element such as a laser diode (LD). The light source is not limited to this. The light source may include a semiconductor light emitting element such as a light emitting diode (LED).

The light deflector 13 is an example of an image forming device that receives irradiation light emitted from the light source device 11 and emits image light forming an image. The light deflector 13 changes the travel direction of the laser beam by using micro electro mechanical systems (MEMS) or the like. The light deflector 13 includes, for example, a scanner, such as one micro MEMS mirror that swings about two orthogonal axes or a mirror system including two MEMS mirrors that each swings or rotates about one axis. The laser beam emitted from the light deflector 13 scans the screen 15. The light deflector 13 may include a polygon mirror or the like instead of the MEMS mirror.

The screen 15 is an example of a screen on which image light emitted from the light deflector 13 forms an image. The screen 15 is a diverging member having a function of diverging a laser beam at a predetermined angle of divergence. The screen 15 includes, for example, as a form of an exit pupil expander (EPE), a transmissive optical element having light diffusing effect, such as a microlens array (MLA) or a diffusion plate. The screen 15 may be a reflective optical element having light diffusing effect such as a micromirror array. The laser beam emitted from the light deflector 13 scans the screen 15 to form an intermediate image 40, which is a two-dimensional image, on the screen 15.

Projection methods of the display device 10 include a "panel method" of using an imaging device, such as a liquid crystal panel, a digital micromirror device (DMD) panel, or a vacuum fluorescent display (VFD), to form the intermediate image 40; and a "laser scanning method" of using a scanner that performs scanning with the laser beam emitted from the light source device 11 to form the intermediate image 40.

The display device 10 according to the embodiment uses the "laser scanning method". The "laser scanning method" can assign emission or non-emission to each pixel and hence can typically form a high-contrast image. Alternatively, the display device 10 may use the "panel method" as the projection method.

The virtual image 45, which is projected on the free-form surface mirror 30 and the windshield 50 with the laser beam (bundle of laser beams) emitted from the screen 15, is magnified from the intermediate image 40 and displayed. The free-form surface mirror 30 is designed and disposed so as to cancel out the inclination, distortion, positional deviation, and so forth, of an image, which occur due to a curved shape of the windshield 50. The free-form surface mirror 30 may be disposed rotatably around a predetermined rotation axis. Thus, the free-form surface mirror 30 can adjust the reflection direction of the laser beam (bundle of laser beams) emitted from the screen 15 to change the display position of the virtual image 45.

The free-form surface mirror 30 is designed by using the known optical design simulation software, to have a certain focal power so that the virtual image 45 can be formed at a desired position. In the display device 10, the focal power of the free-form surface mirror 30 is set so that the virtual image 45 is displayed, for example, at a position (depth position) in a range of from 1 m to 30 m (preferably 10 m or less) from the viewpoint position of the observer 3. The free-form surface mirror 30 may be a concave mirror or another optical element having focal power. The free-form surface mirror 30 is an example of an image forming optical system.

The windshield 50 is a transmissive reflector that has a function (partial reflection function) of transmitting a portion of a laser beam (bundle of laser beams) and reflecting at least a portion of the residual portion of the laser beam. The windshield 50 functions as a semi-transmissive mirror that enables the observer 3 to visually recognize the front view and the virtual image 45. The virtual image 45 is, for example, image information that enables the observer 3 to visually recognize vehicle information (speed, travel distance, and so forth), navigation information (route guide, traffic information, and so forth), and warning information (collision warning and so forth). The transmissive reflector may be a front windshield or the like that is provided independently from the windshield 50. The front windshield 50 is an example of a reflector.

The virtual image 45 may be displayed so as to be superimposed on the scenery ahead of the windshield 50. The front windshield 50 is not flat but is curved. For this reason, the position at which the virtual image 45 is formed is determined by the curved surface of the free-form surface mirror 30 and the windshield 50. In some embodiments, the windshield 50 may be a semitransparent mirror (combiner) that serves as a separate transmissive reflector having a partial reflection function.

With such a configuration, a laser beam (bundle of laser beams) emitted from the screen 15 is projected toward the free-form surface mirror 30, and is reflected by the windshield 50. With the light reflected by the windshield 50, the observer 3 can visually recognize the virtual image 45, which is a magnified image of the intermediate image 40 formed on the screen 15.

Figure 3:
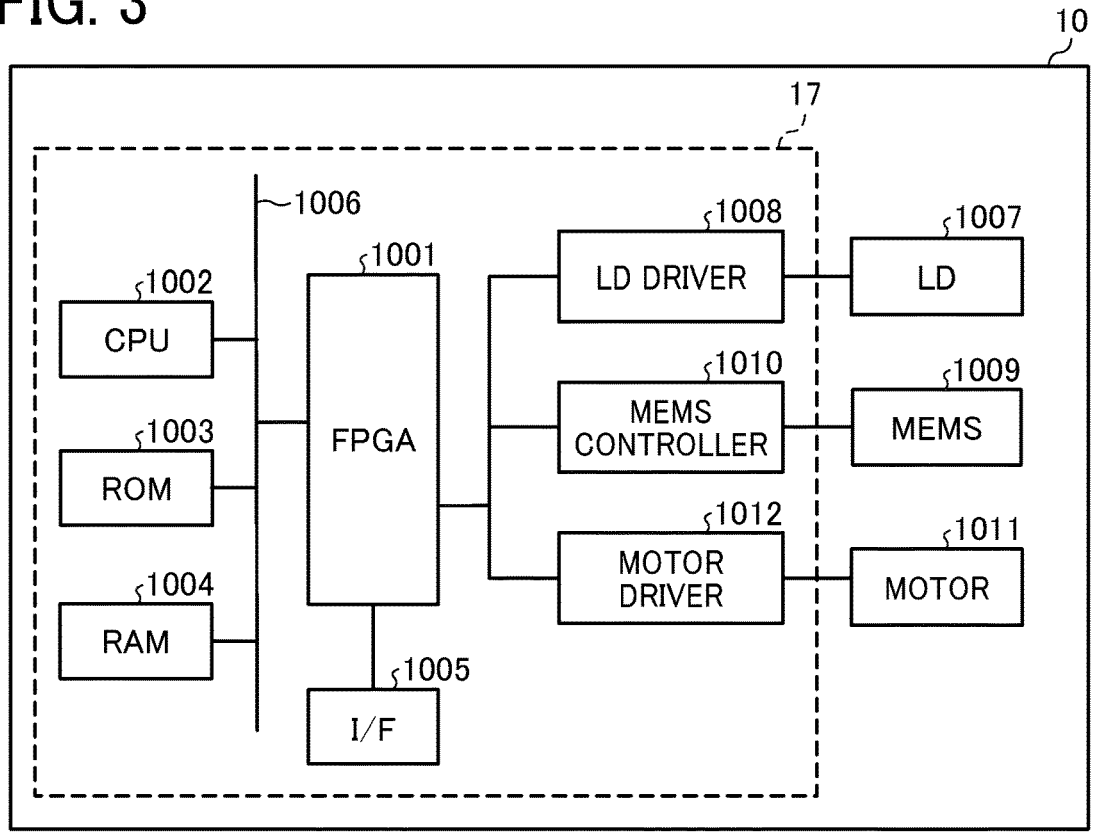
FIG. 3 is a block diagram of a hardware configuration of a display device according to an embodiment of the present disclosure.

FIG. 3 is a block diagram of an example of the hardware configuration of the display device 10 according to an embodiment of the present disclosure. When necessary, some components or elements may be added to or deleted from the hardware configuration illustrated in FIG. 3.

The display device 10 includes a controller 17 that controls the operation of the display device 10. For example, the controller 17 is a circuit board or integrated circuit (IC) chip mounted inside the display device 10. The controller 17 includes a field-programmable gate array (FPGA) 1001, a central processing unit (CPU) 1002, a read only memory (ROM) 1003, a random access memory (RAM) 1004, an interface (I/F) 1005, a data bus line 1006, a laser diode (LD) driver 1008, a micro-electromechanical systems (MEMS) controller 1010, and a motor driver 1012.

The FPGA 1001 is an integrated circuit whose setting can be changed by the designer of the display device 10. The LD driver 1008, the MEMS controller 1010, and the motor driver 1012 generate drive signals in accordance with control signals from the FPGA 1001. The CPU 1002 is an integrated circuit that controls the entirety of the display device 10. The ROM 1003 is a storage device that stores programs to control the CPU 1002. The RAM 1004 is a storage device that functions as a work area of the CPU 1002. The I/F 1005 is an interface for communication with an external device. For example, the/F 1005 is coupled to the controller area network (CAN) of a vehicle.

An LD 1007 is, for example, a semiconductor light emitting element partly constituting the light source device 11. A MEMS 1009 is a device that partly constitutes the light deflector 13 and that displaces a scanning mirror. A motor 1011 is an electric motor that rotates the rotation axis of the free-form surface mirror 30.

Figure 4:
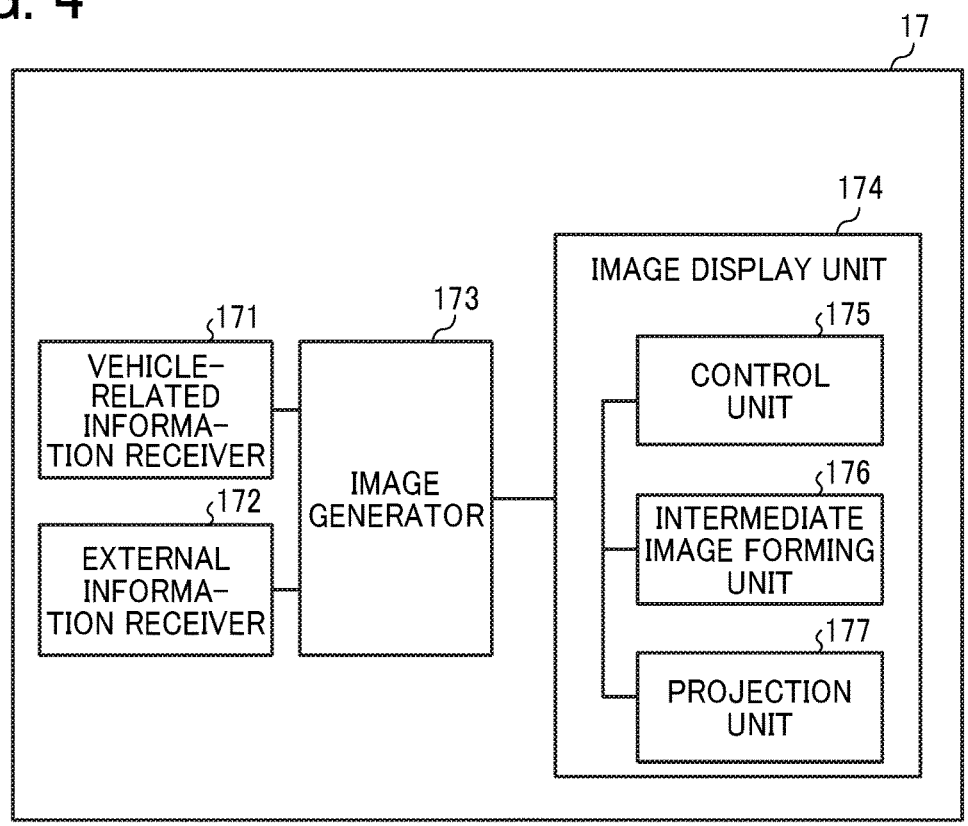
FIG. 4 is a block diagram of a functional configuration of the display device in FIG. 3.

FIG. 4 is a block diagram of a functional configuration of the display device according to an embodiment. The functions that are implemented by the display device 10 include a vehicle-related information receiver 171, an external information receiver 172, an image generator 173, and an image display unit 174.

The vehicle information receiver 171 is a function of receiving automobile information (information such as the speed and the travel distance) from the CAN and so forth.

For example, the vehicle-related information receiver 171 is implemented by some of the elements illustrated in FIG. 3. In particular, the vehicle-related information receiver 171 may be implemented by the I/F 1005, the processing performed by the CPU 1002, and a program stored in the ROM 1003.

The external information receiver 172 receives external information (for example, position information from the global positioning system (GPS), routing information from a navigation system, and traffic information) of the vehicle from an external network. For example, the external information receiver 172 is implemented by some of the elements illustrated in FIG. 3. In particular, the external information receiver 172 may be implemented by the interface 1005, the processing performed by the CPU 1002, and a program stored in the ROM 1003.

The image generator 173 is a function to generate image data, which is used to display the intermediate image 40 and the virtual image 45, based on the data input from the vehicle-related information receiver 171 and the external information receiver 172. For example, the image generator 173 is implemented by some of the elements illustrated in FIG. 3. In particular, the image generator 173 may be implemented by the processing performed by the CPU 1002, and a program stored in the ROM 1003.

The image display unit 174 is a function to form the intermediate image 40 on the screen 15 based on the image data generated by the image generator 173, and to project the laser beams (bundle of laser beams) that form the intermediate image 40 towards the windshield 50 to display the virtual image 45. The image display unit 174 is implemented by some of the elements illustrated in FIG. 3. In particular, the image display unit 174 may be implemented by the FPGA 1001 and the CPU 1002, and a program stored in the ROM 1003.

The image display unit 174 includes a control unit 175, an intermediate image forming unit 176, and a projection unit 177. In order to form the intermediate image 40, the control unit 175 generates a control signal used to control the operation of the light source device 11 and the light deflector 13. Moreover, the control unit 175 generates a control signal that controls the operation of the free-form surface mirror 30 to display the virtual image 45 at a desired position.

The intermediate image forming unit 176 forms the intermediate image 40 on the screen 15 based on the control signal generated by the controller 175. The projection unit 177 projects a laser beam constituting the intermediate image 40 onto a transmissive reflector (the windshield 50 or the like) to form the virtual image 45, which is to be visually recognized by the observer 3.

Figure 5:
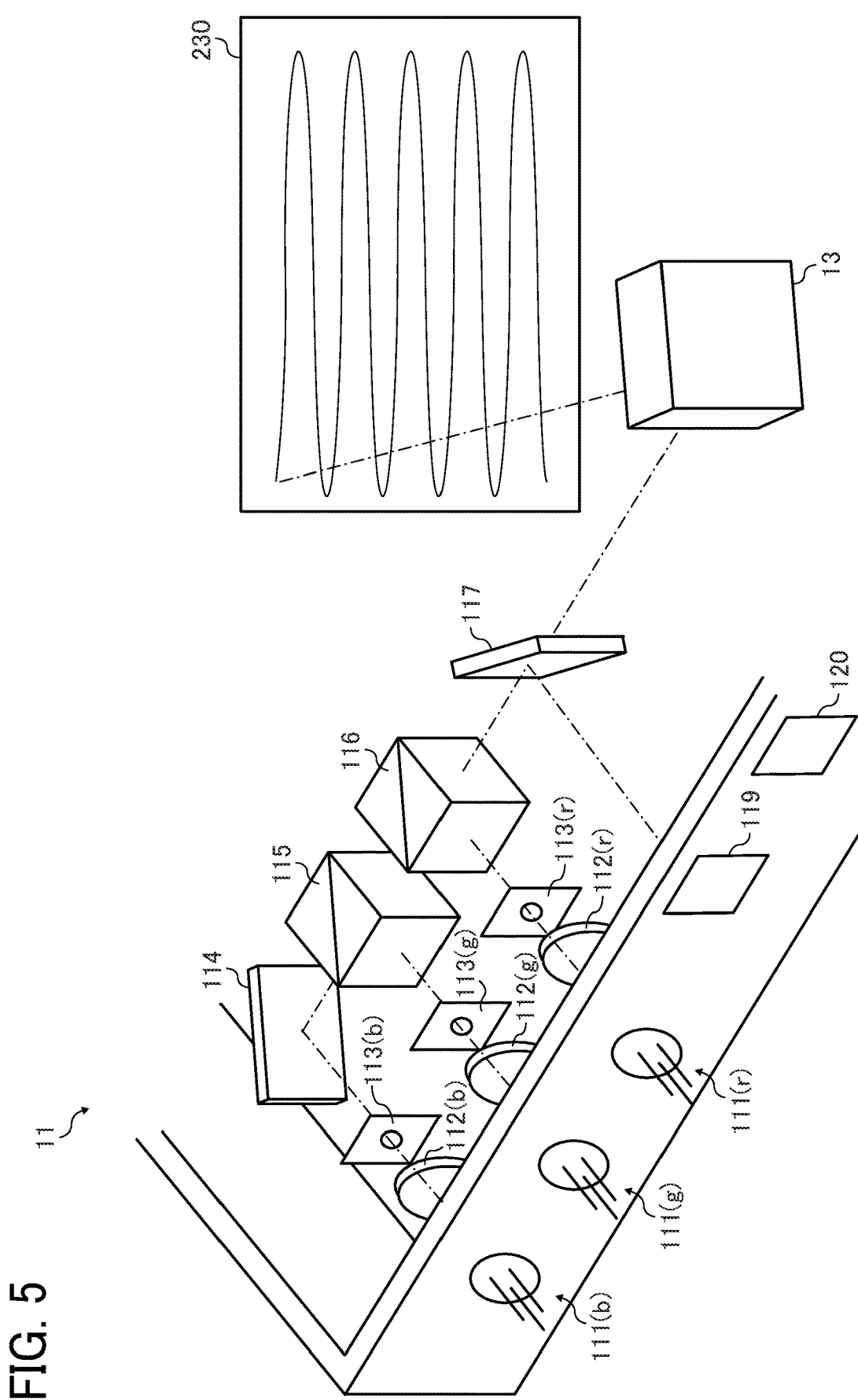
FIG. 5 is an illustration of an example of a specific configuration of a light source device according to an embodiment of the present disclosure.

FIG. 5 is an illustration of an example of a specific configuration of the light source device 11 according to an embodiment of the present disclosure. The light source device 11 includes light source elements 111(*r*), 111(*g*), and 111(*b*) (these light source elements may be referred to simply as a light-source element 111 in the following description when it is not necessary to distinguish each of the light-source elements), coupling lenses 12(*r*), 112(*g*), and 112(*b*) (these coupling lenses are referred to simply as a coupling lens 112 in the following description when it is not necessary to distinguish the coupling lenses), apertures 113(*r*), 113(*g*), and 113(*b*) (these apertures are referred to simply as an aperture 113 in the following description when it is not necessary to distinguish the apertures), a mirror 114, combiners 115 and 116, an optical branching element 117, a photodetector 119, and a temperature sensor 120.

The light source elements 111(r), 111(g), and 111(b) for three colors (R, G, B) are, for example, laser diodes (LDs) each having one emission point or multiple emission points. The light source elements 111(r), 111(g), and 111(b) emit laser beams (bundle of laser beams) having different wavelengths λR, λG, and λB, respectively. For example, λR=650 nanometers (nm), G=515 nm, and B=450 nm. The light source device 11 has a plurality of light source elements 111 (111(r), 111(g), and 111(b)) that emit bundles of light beams having different wavelengths to generate colors used for an image. In view of a reduction in size and cost, the light source elements 111(r), 111(g), and 111(b) are arranged on the same surface of the light source device 11, which enables a circuit board that drives the light source element 111 to be shared. The light source element 111 in FIG. 5 has a configuration corresponding to the LD 1007 in FIG. 3.

The emitted bundles of laser beams are coupled by the coupling lenses 112(r), 112(g), and 112(b), respectively. The bundles of laser beams (light flux) that are emitted from the light source element 111 are coupled and collimated by the coupling lens 112. The semiconductor laser typically emits a laser beam having a high directionality while diverging the laser beam at the exit end. For this reason, the emitted laser beam gradually attenuates. In order to reduce the loss of the intensity of the bundles of the laser beams emitted from the light source device 11, the coupling lens 112 is used to collimate the bundles of the light beams, thus the emitted bundles of laser beams become collimated light beams.

The coupled bundles of laser beams (light flux) are shaped by the apertures 113(r), 113(g), and 113(b), respectively. The shape of the apertures 113(r), 113(g), and 113(b) may be various kinds of shape such as a circle, an ellipse, a rectangle, and a square depending on, for example, certain predetermined conditions such as the divergence angle of the bundles of laser beams (light flux). The laser beams (light flux) that are shaped by the apertures 113(r), 113(g), and 113(b) are combined by the mirror 114 and the combiners 115 and 116.

The mirror 114 deflects and guides the bundle of the laser beam emitted from the light source element 111(b) toward the optical branching element 117. The combiner 115 combines the bundle of the laser beam guided by the mirror 114 and the bundle of the laser beam emitted from the light source emitting 111(g) together. The combiner 116 further combines the bundle of the laser beams combined by the combiner 115 and the bundle of the laser beam emitted from the light source element 11(r) together. The combiners 115 and 116 are plate-like or prismatic dichroic mirrors, and reflect or transmit the laser beams therethrough according to the wavelength of the laser beams to combine the laser beams into one bundle of laser beams that travels along one optical path. The bundles of laser beams emitted from the light source elements 111(r), 111(g), and 111(b) are combined by the combiners 115 and 116, and the combined bundle of the laser beams travel along the same optical path.

Some of the light that is incident on the optical branching element 117 pass through the optical branching element 117, and different some of the light (at least a part of the residual portion of the light) that is incident on the optical branching element 117 is reflected by the optical branching element 117. In other words, the combined laser beams 116 (light flux) are branched into transmitted light and reflected light by the optical branching element 117. It is satisfactory as long as the optical branching element 117 is disposed in the optical path between the combiner 116 and the light deflector 13.

The light deflector 13 is irradiated with the transmitted light. As a result, the transmitted light is used to draw an image or display a virtual image within the scanning area (scanning range) 230 on the screen 15. In other words, the transmitted light is used as light for projecting an image. The photodetector 119 is irradiated with the reflected light. As a result, the reflected light is used as monitoring light that adjusts the color or brightness of the virtual image.

The photodetector 119, which is an example of an output power detector, detects the intensity of the monitoring light branched by the optical branching element 117. It is desired that the photodetector 119 is shared by the plurality of light source elements 111 to detect the intensity of the bundle of laser beams emitted from the plurality of light source elements 11 for a more compact light source device 11.

In the light source device 11 provided with a plurality of laser beam sources with different wavelengths, the colors of the virtual image to be displayed are produced based on the white balance for reproducing a white color in the same manner as in the liquid crystal displays (LCDs). For this reason, the white balance (light intensity ratio) is to be set in an appropriate manner. The intensity of the bundle of light beam emitted from each of the light source elements 111 varies with the environmental changes such as changes in temperature, and thus a desired light intensity to achieve the white balance also varies.

In view of the above circumstances, the light source device 11 detects the fluctuation in the intensity of a laser beam (light flux) emitted from each light source element 111 with the photodetector 119, and controls the light intensity (automatic phase control (APC)) of the laser beam (light flux) emitted from each light source element 111. In the light source device 11, some of the laser beams combined by the combiner 116 are directed toward the photodetector 119 by the optical branching element 117. In the light source device 11, the optical branching element 117 is arranged such that the laser beam is reflected by the optical branching element 117 and guided to the photodetector 119, and the laser beam (light flux) passes through the optical branching element 117 and is guided toward the light deflector 13. In this case, a branching plane of the optical branching element 117, at which the laser beams are branched into the transmitted laser beam and the reflected laser beam, serves as an incident plane on which the laser beams are incident.

In addition, the light source device 11 includes a temperature detector 120 that detects an ambient temperature of each light source element 111 (the light sources (11(r), 11(g), and 111(b)) so that the controller (17) changes the intensity of the laser beams (light flux) emitted from the light source elements 111 (APC) based on the temperature detected by the temperature detector 120, according to a control signal.

Figure 6:
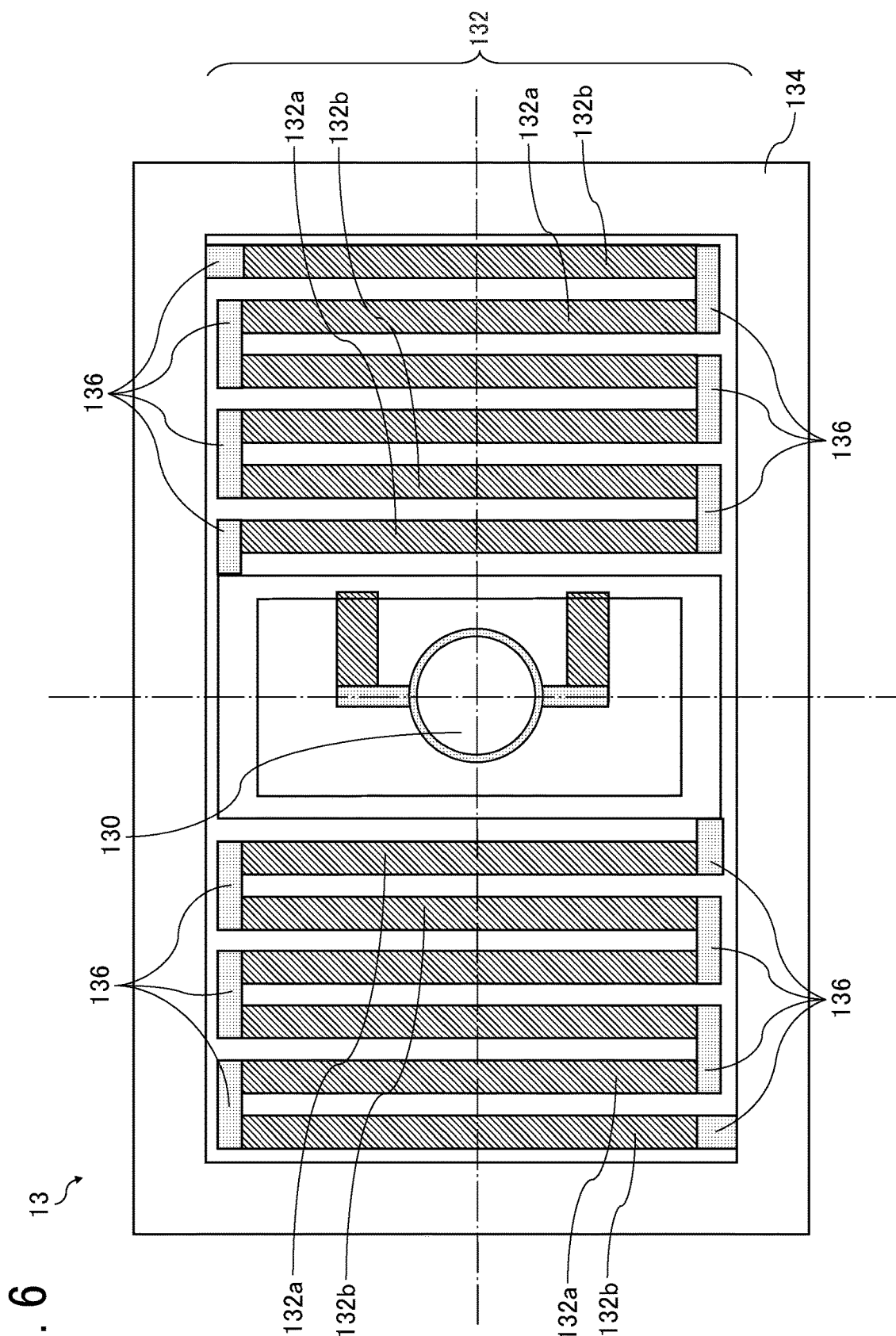
FIG. 6 is an illustration of a specific configuration of a light deflector according to an embodiment.

FIG. 6 is an illustration of a specific configuration of the light deflector 13 according to an embodiment of the present disclosure. The light deflector 13 is a MEMS mirror that is manufactured through a semiconductor process, and includes a mirror 130, a serpentine beam 132, a frame 134, and a piezoelectric member 136. The light deflector 13 is an example of a light deflector that performs scanning in a main-scanning direction which is an example of a first scanning direction, and a sub-scanning direction which is an example of a second scanning direction that intersects with (orthogonal to) the first scanning direction.

The mirror 130 has a reflection plane that reflects the laser beams emitted from the light-source device 11 towards the screen 15 side. The light deflector 13 defines a pair of serpentine beams 132 with the mirror 130 interposed therebetween. The serpentine beams 132 have a plurality of turning portions. Each of these turning portions is configured by a first beam 132a and a second beam 132b that are arranged alternately. Each of the pair of serpentine beams 132 is supported by the frame 134. The piezoelectric member 136 is disposed such that the first beam 132a and the second beam 132b, which are adjacent to each other, are coupled to each other. The piezoelectric member 136 applies different levels of voltage to the first beam 132a and the second beam 132b to bend each of the first beam 132a and the second beam 132b differently.

As a result, the first beam 132a and the second beam 132b, which are adjacent to each other, bend in different directions. As the bending force is accumulated, the mirror 130 rotates in the vertical direction around the horizontal axis. With such a configuration as above, the light deflector 13 can perform optical scanning in the vertical direction at a low voltage. An optical scanning in the horizontal direction around the axis in the vertical direction is implemented by the resonance produced by a torsion bar or the like coupled to the mirror 130.

Figure 7:
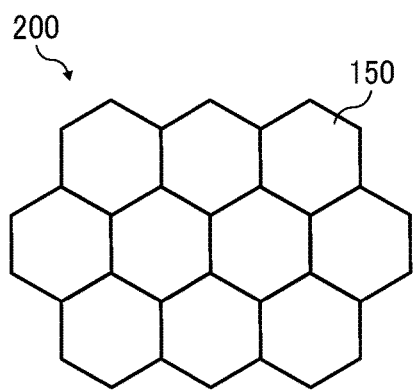
FIG. 7 is an illustration of an example of a specific configuration of a screen according to an embodiment.

FIG. 7 is an illustration of an example of a specific configuration of a screen according to an embodiment. The laser beam emitted from the LD 1007 that configures a part of the light source device 11 form an image on the screen 15. The screen 15 serves as a divergent part that diverges the laser beam at a predetermined divergence angle. As an example configuration in which a plurality of curved portions through which the light diverges are provided, the screen 15 as illustrated in FIG. 7 has a microlens-array structure in which a plurality of hexagonal-shaped microlenses 150 are arranged with no gap therebetween. The microlenses 150 are convex portions that are an example of the curved portions. The lens diameter of each one of the microlenses 150 (the distance between two sides that are opposed to each other) is about 200 micrometers (μm). As the microlenses 150 of the screen 15 have a hexagonal shape, the multiple microlenses 150 can be arrayed with high density. The microlens array 200 and the microlenses 150 according to the present embodiment will be described later in detail.

Figure 8A:
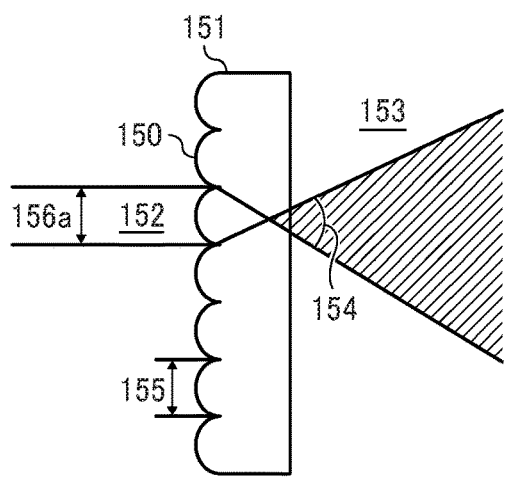
FIGS. 8A and 8B are illustrations for describing a difference in operation due to differences in sizes of the diameter of incident light flux and the lens diameter in a microlens array.
Figure 8B:
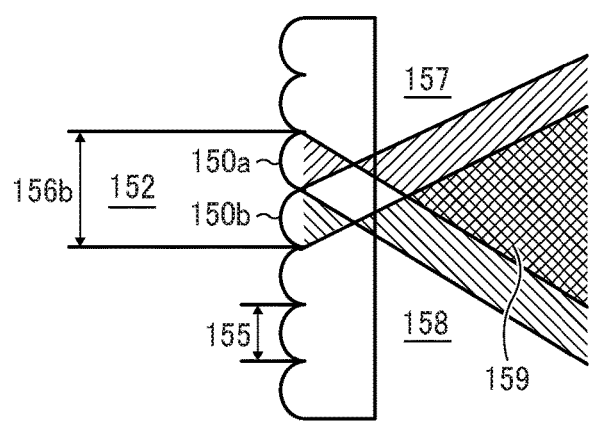

FIGS. 8A and 8B are illustrations for describing a difference in operation due to differences in sizes of the diameter of incident light flux and the lens diameter in a microlens array, according to an embodiment of the present disclosure. As illustrated in FIG. 8A, the screen 15 is configured by an optical plate 151 in which the multiple microlenses 150 are neatly arranged. When incident light 152 scans the optical plate 151, the incident light 152 diverges as passing through the microlens 150, and the incident light 152 becomes diverging light 153. Due to the structure of the microlenses 150 of the screen 15, the incident light 152 can diverge at a desired divergence angle 154. The microlenses 150 are designed to each have a lens diameter 155 that is larger than the diameter 156a of the incident light 152. Thus, the screen 15 does not cause interference between the lenses and reduces occurrence of interference noise.

FIG. 8B is a diagram of the optical paths of diverging light beams when the diameter 156b of the incident light 152 is twice wider than the lens diameter 155 at which the microlenses 150 are arranged. The incident light 152 is incident on two microlenses 150a and 150b, and these two microlenses 150a and 150b produce two diverging light beams 157 and 158, respectively. At this time, the two divergent light beams are present in an area 159, and hence interference between the divergent light beams may occur. When the interference light enters the eyes of the observer, the observer visually recognizes the interference light as interference noise.

In view of the above circumstances, the lens diameter 155 at which the microlenses 150 are arranged is designed to be wider than the diameter 156 of the incident light 152 in order to reduce the interfering noise. A configuration with convex lenses is described as above with reference to FIG. 8A and FIG. 8B. However, no limitation is indicated thereby, and advantageous effects can be expected in a similar manner in a configuration with concave lenses.

Figure 9:
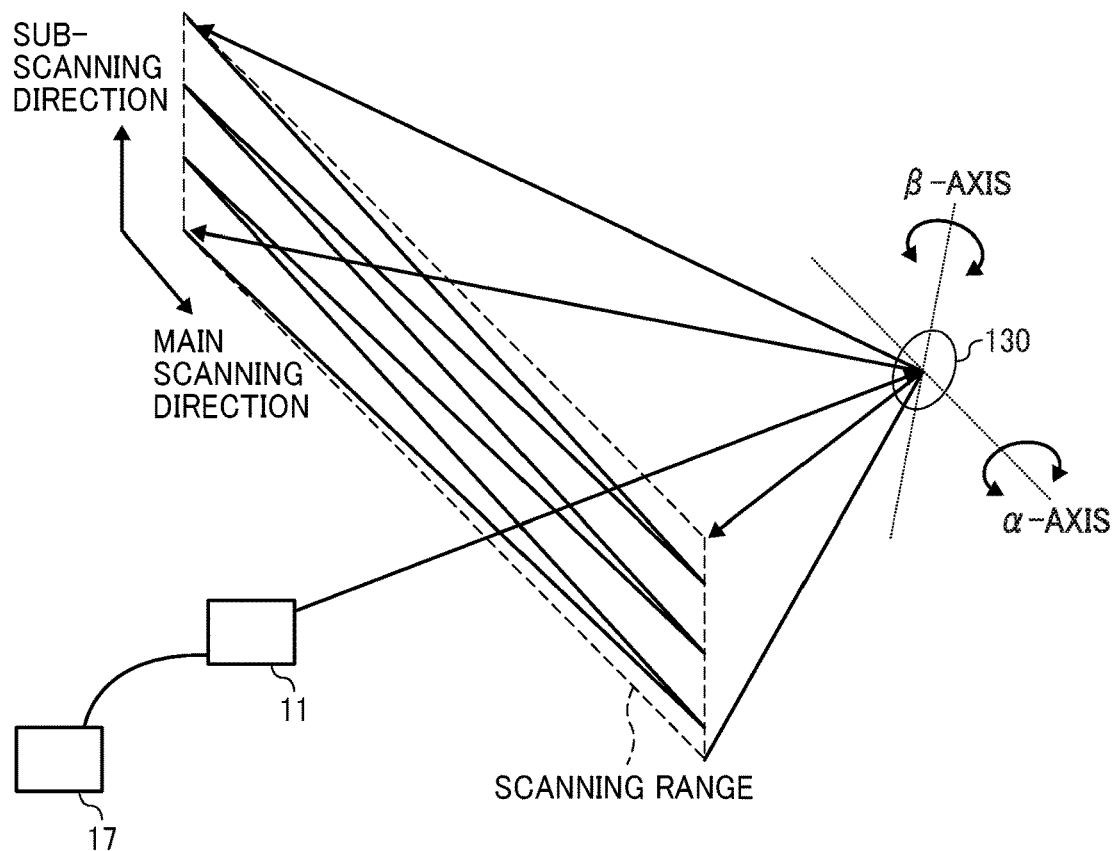
FIG. 9 illustrates correspondence between a mirror of the light deflector and the scanning range.

FIG. 9 illustrates correspondence between a mirror 130 of the light deflector 13 and the scanning range. The FPGA 1001 controls the emission intensity, the on/off timing, and the light waveform of each of the light source elements of the light source device 11. Each of the light source elements of the light source device 11 is driven by the LD driver 1008 and emits a laser beam. As illustrated in FIG. 9, a laser beam that is formed by combining the optical paths of laser beams emitted from the elements of the light source is two-dimensionally deflected by the mirror 130 of the light deflector 13 around the a axis and around the 0 axis. Then, the laser beam is emitted as scanning light onto the screen 15 via the mirror 130. In other words, the screen 15 is two-dimensionally scanned by main scanning and sub-scanning by the light deflector 13.

In the present embodiment, the entire area to be scanned by the light deflector 13 may be referred to as a scanning range. The scanning beam scans (two-way scans) the scanning range of the screen 15 in an oscillating manner in the main scanning direction at a high frequency of about 20,000 to 40,000 hertz (Hz), and scans (one-way scans) the scanning range of the screen 15 in the sub-scanning direction at a low frequency of about a few tens of Hz. That is, the light deflector 13 performs raster scan on the screen 15. In this configuration, the display device 10 controls the light emission of the multiple light-source elements according to the scanning position (the position of the scanning beam). Accordingly, an image can be drawn on a pixel-by-pixel basis and a virtual image can be displayed.

As described above, the sub-scanning cycle is about a few tens of Hz. Accordingly, the length of time to draw an image of one frame, i.e., the length of time to scan one frame (one cycle of two-dimensional scanning) is a few tens of millisecond (msec). For example, assuming that the main-scanning cycle and the sub-scanning cycle are 20,000 Hz and 50 Hz, respectively, the length of time to scan one frame is 20 msec.

Figure 10:
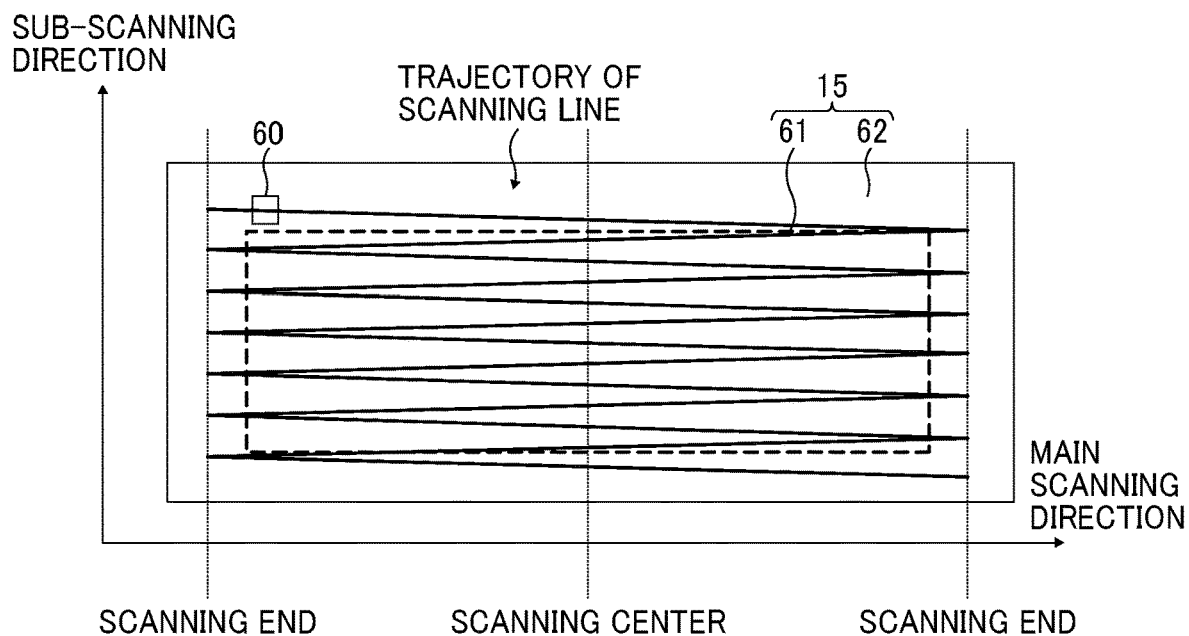
FIG. 10 is an illustration of an example of a trajectory of a scanning line when two-dimensional scanning is performed, according to an embodiment of the present disclosure.

FIG. 10 is an illustration of an example of a trajectory of a scanning line when two-dimensional scanning is performed, according to an embodiment of the present disclosure. As illustrated in FIG. 10, the screen 15 includes an image area 61 (i.e., an effective scanning area) and a frame area 62 that surrounds the image area 61. In the image area 61, the intermediate image 40 is drawn on. Within the image area 61, an image is formed as the light source device 11 is turned on based on the image data (the image area 61 is irradiated with the modulated light).

In the present embodiment, the scanning range includes the image area 61 and a part of the frame area 62 (i.e., a portion around the periphery of the image area 61) on the screen 15. In FIG. 10, the track of the scanning in the scanning range is indicated by a zgzag line. For the sake of explanatory convenience, the number of scanning lines in FIG. 10 is less than the actual number of scanning lines.

As described above, the screen 15 is configured by a transmissive optical element that has light diffusing effect, such as the microlens array 200. The image area 61 may not be a rectangular surface or a flat surface, and may be a polygonal surface or a curved surface. Depending on the device layout, the screen 15 may be, for example, a reflective optical element that has light diffusing effect, such as a micromirror array. In the following description of the present embodiment, it is assumed that the screen 15 is configured by the microlens array 200.

The screen 15 is provided with a synchronous detection system 60 that includes a light receiver disposed in a peripheral area of the image area 61 (a part of the frame area 62) in the scanning range. In FIG. 10, the synchronous detection system 60 is disposed on the −X and +Y side of the image area 61. More specifically, the synchronous detection system 60 is disposed at a corner on the +Y side. The synchronous detection system 60 detects the operation of the light deflector 13 and outputs a synchronous signal that determines determining the start timing of scanning or the end timing of scanning to the FPGA 1001.

Figure 11:
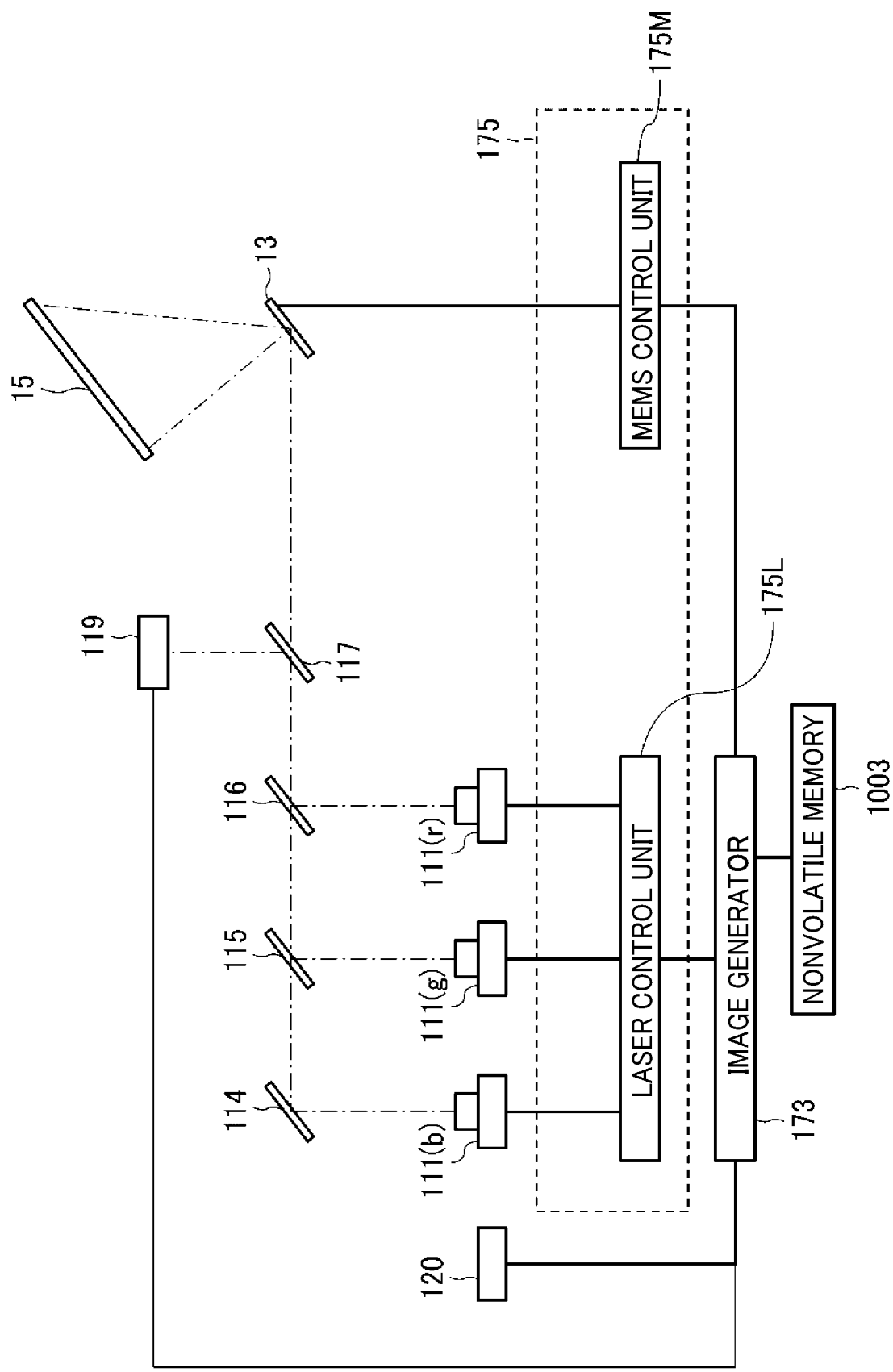
FIG. 11 is a functional block diagram of the light source device according to an embodiment.

FIG. 11 is a functional block diagram of the light source device 11 according to an embodiment. Note that the description of elements similar to those of FIG. 4 will be omitted.

The image generator 173 generates image information used to form the intermediate image 40 and the virtual image 45 to be displayed, and also generates a control signal for controlling the operation of the light deflector 13. The control signal includes a horizontal synchronizing signal and a vertical synchronizing signal, which are synchronized with the formation of these images.

The nonvolatile memory (ROM) 1003 stores data about maximum output value of each of the laser beams of the plurality of light source elements 111. The image generator 173 generates a control signal used to control the operation of the light source device 11 so as to maintain the white balance constant, based on data of the light intensity acquired from the photodetector 119, data of the temperature acquired from the temperature detector 120, and data of the maximum output power of a laser beam of each of the plurality of light source elements 111 acquired from the nonvolatile memory (ROM) 1003.

The control unit 175 includes a laser control unit 175L and a MEMS control unit 175M. The MEMS control unit 175M controls the operation of the light deflector 13 based on the control signal generated by the image generator 173.

The laser control unit 175L controls the operation of the light source device 11 based on the control signal generated by the image generator 173. Specifically, the laser control unit 175L controls the output power ratio between the laser beams of the plurality of light source elements 111 so as to maintain a constant white balance.

Further, in the present embodiment, the output power ratio between the laser beams of the plurality of light source elements 111 is controlled based on the data of the temperature output from the temperature detector 120. Accordingly, the white balance can be maintained constant even when the white balance changes due to the temperature changes.

Figure 12:
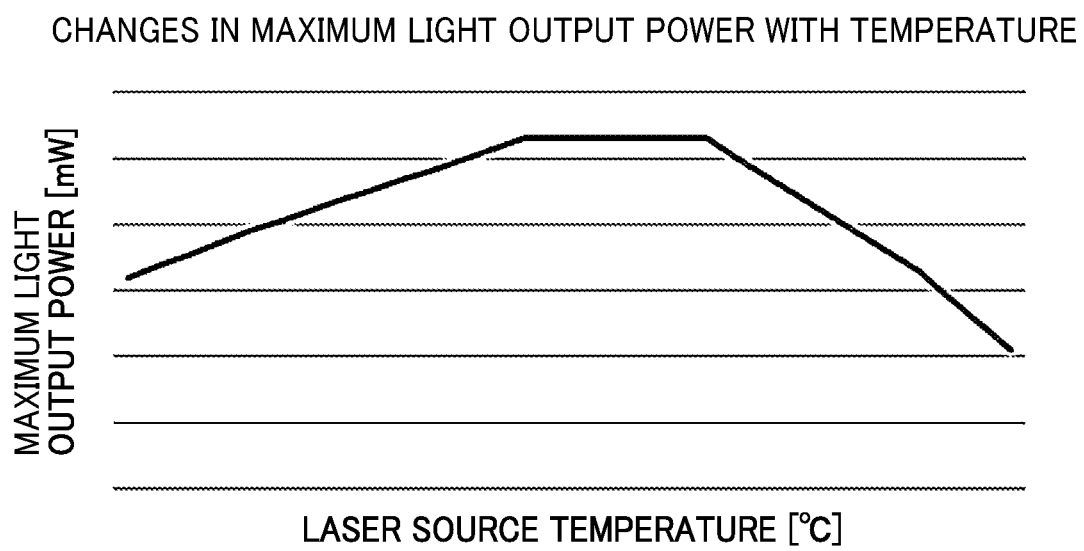
FIG. 12 is a graph of the maximum output power of a laser beam and the temperature of a laser source.

FIG. 12 is a graph of the maximum output power of a laser beam and the temperature of a laser source, according to an embodiment of present disclosure.

The maximum output power of a laser beam of the light source element 111 changes with the temperature. As illustrated in FIG. 12 for example, the maximum light output power is largest at near the normal temperature that is set to 25° C., which is a typical room temperature, and decreases as the temperature increases or decreases.

In this case, if the laser source emits a light beam assuming that the upper limit of the maximum light output power is the maximum light output power near the normal temperature, when the temperature of the laser source changes, the output power of the laser beam that is emitted from the laser source exceeds the maximum light output power at the temperature that has changed. As a result, the laser source might be damaged. Further, if the laser source emits a light beam assuming that the upper limit of the maximum light output power is the maximum light output power at a high temperature (for example, 80° C.) or at a low temperature (for example, 0° C.), the light output power near the normal temperature is limited to less than the maximum light output power near the normal temperature, and thus a poor efficiency is obtained.

In view of the above circumstances, in the present embodiments, the maximum output power of a laser beam is to be set appropriately.

FIG. 13 is a table representing the maximum output values of laser beams with respect to the temperature, which are stored in a nonvolatile memory 1003.

As illustrated in FIG. 13, the table with data (table data) is stored in the nonvolatile memory 1003 such that the maximum output values of laser beams emitted from the light source elements 111(r), 111(g), and 111(b) of three colors (R, G, B) are indicated for each temperature. The temperature interval of 5° C. in FIG. 13 is only one example, and any desired interval is available.

The image generator 173 in FIG. 11 acquires the maximum output values of the laser beams of the three colors (R, G, B) in association with a temperature value (temperature data) output from the temperature detector 120, referring to the table data stored in the nonvolatile memory 1003 based on the temperature data. The image generator 173 may acquire the maximum output value of a temperature closest to the acquired temperature value.

Alternatively, the image generator 173 may acquire the maximum output values of two temperatures close to the acquired temperature value, and then perform linear interpolation.

The temperature characteristics illustrated in FIG. 12 differ between the light source elements 111(r), 111(g), and 111(b) of the three colors (R, G, B) as illustrated in FIG. 13. In other words, the ratio in the maximum output power between the laser beams of the light source elements 111(r), 111(g), and 111(b) of the three colors (R, G, B) differ with the temperature.

The image generator 173 changes the ratio in the maximum output power between the laser beams of the light source elements 111(r), 111(g), and 111(b) of the three colors (R, G, B) based on the detection result of the temperature detector 120. As a result, the image generator 173 can appropriately set the upper limit of the output power values of the laser beams within the dimmable range that is a range in which the white balance can be maintained constant. A specific example is described below.

The white balance is obtained when the ratio between the intensity of the laser beams of the colors (RGB) becomes 1.99:1.00:0.78, according to Example 1 in which the temperature is 20° C. Referring to the maximum output power at 20° C. in the table of FIG. 13, the laser beam of the green color (G) is a bottleneck, and the upper limit of the output power of the laser beams R, G, and B are 199 mW, 100 mW, and 78 mW, respectively, within the range in which the white balance can be maintained constant.

The white balance is obtained when the ratio between the intensity of the laser beams of the colors (RGB) becomes 1.65:1.00:0.76, according to Example 2 in which the temperature is 0° C. Referring to the maximum output power at 0° C. in the table of FIG. 13, the laser beam G is a bottleneck, and the upper limit of the output power of the laser beams R, G, and B are 132 mW, 80 mW, and 60.8 mW, respectively, within the range in which the white balance can be maintained constant.

The white balance is obtained when the ratio between the intensity of the laser beams of the colors (RGB) becomes 1.00:0.29:0.23, according to Example 3 in which the temperature is 80° C. Referring to the maximum output power at 80° C. in the table of FIG. 13, the laser beam of the red color (R) is a bottleneck, and the upper limit of the output power of the laser beams R. G, and B are 150 mW, 43.5 mW, and 34.5 mW, respectively, within the range in which the white balance can be maintained constant.

The white balance is obtained when the ratio between the intensity of the laser beams R, G, and B becomes 1.65:1.00:0.76, according to Comparative Example 1 in which the temperature is 0° C. In stead of the table with data for each temperature as illustrated in FIG. 13, a table indicating the fixed maximum output values of the laser beams R. G, and B, which are fixed values irrespective of the temperature, may be used to determine the output values of the laser beams R, G, and B.

For example, when it is assumed that the values of 200 mW, 100 mW, and 100 mW of the laser beams R, G, and B at 20° C. in the table of FIG. 13 are used as the fixed output values for the maximum output power table, the laser beam G is a bottleneck, and the upper limit of the output power of the laser beams R, G, and B are 165 mW, 100 mW, and 76 mW, respectively, within the range in which the white balance can be maintained constant.

However, under the environments where the temperature is at 0° C., as the maximum output values of the laser beams R, G, and B are 150 mW, 80 mW, and 100 mW, the laser sources for the red color (R) and the green color (G) might be damaged.

The white balance is obtained when the ratio between the intensity of the laser beams of the colors (RGB) becomes 1.65:1.00:0.76, according to Comparative Example 2 in which the temperature is 0° C. Unlike Comparative Example 1, when it is assumed that the values of 100 mW, 50 mW, and 60 mW of the laser beams R, G, and B at −40° C. in the table of FIG. 13 are used as the fixed output values for the maximum output power table, the laser beam G is a bottleneck, and the upper limit of the output power of the laser beams R, G, and B are 82.5 mW, 50 mW, and 45.6 mW, respectively, within the range in which the white balance can be maintained constant.

In this case, the upper limit values of the laser beams R, G. and B within the range that maintains a constant white balance in Comparative Example 2 are respectively lower than those in Example 2 in which the temperature is 0° C. Accordingly, the output power is limited to less than the maximum light output power, and thus a poor efficiency is obtained.

FIG. 14 is a flowchart for describing a process of controlling the output power of the laser beams.

The image generator 173 acquires temperature data from the temperature detector 120 (step S1).

The image generator 173 determines whether the acquired temperature has changed by a certain degree or more as compared to the temperature acquired in the previous adjustment of the white balance (since the previous white balance adjustment)(step S2). When it is determined that the temperature has not changed by a certain degree or more (NO in step S2), the process returns to step S1. When it is determined that the temperature has changed by a certain degree or more (YES in step S2), the process proceeds to step S3.

In step S3, the image generator 173 acquires the maximum output power values of the laser beams of the three colors (R, G, and B) associated with the acquired temperature (temperature data) by referring to the table data stored in the nonvolatile memory 1003, and based on the acquired maximum output values, sets maximum target light intensity of the light source elements 111(r), 111(g), and 111(b) of the three colors (R, G, and B) (step S3).

The image generator 173 acquires the data of light intensity from the photodetector 119 while increasing the forward current in the lasers (R. G, and B) so as to obtain the property of the forward current and the light intensity of the laser beams of the light source elements 111(r), 111(g), and 111(b) (step S4).

The image generator 173 sets a target light intensity for each of the laser beams of the light source elements 111(r), 111(g), and 111(b) of the three colors (R, G, B) so that the white balance is constant with the light intensity less than or equal to the maximum target light intensity for each color. In other words, the image generator 173 sets the ratio in output power between the laser beams of the light source elements 111(r), 111(g), and 111(b) of the three colors (R, G, B) so that the white balance is constant with the light intensity less than or equal to the maximum target light intensity for each color (step S5).

In this case, assuming that the current wavelengths of the light source elements 111(r), 111(g), and 111(b) are, for example, 650 nm, 515 nm, and 445 nm, the light intensity (the light-emission intensity) of two of the light source elements 111(r), 111(g), and 111(b) are determined to create a certain color P, and the light intensity (the light-emission intensity) of the remaining one light source element is set to a value corresponding to the color P to obtain a desired color that is white for the white valance. For example, when the temperature is 20° C., the maximum output power values of the light source elements 111(r), 111(g), and 111(b) are obtained by referring to the table in FIG. 13, which are 200 mW, 100 mW, and 100 mW, respectively. Within the range that does not exceed the obtained maximum output power values, the light-emission intensity of the light source element 111(r) and the light source element 111(g) are set to 165 mW and 100 mW, respectively so as to generate a color P. Then, the light-emission intensity of the remaining light source element 111(b) is set to 76 mW that corresponds to the color P.

Then, the control unit 175 controls the amount of current to be applied to the light source elements 111(r), 11(g), and 111(b) based on the property obtained in step S4 so as to obtain the target light intensity for each of the laser beams of the light source elements 111(r), 111(g), and 111(b).

As described above, the light source device 11 according to one embodiment of the present disclosure outputs a plurality of laser beams of different color components. In the light source device 11, the ratio in the maximum output power between the plurality of laser beams is variable. With this configuration, the upper limit of the output power values of the plurality of laser beams can be appropriately set within the dimmable range.

The light source device 11 includes a temperature detector 120 that detects a temperature and changes the ratio in the maximum output power between the plurality of laser beams based on the detection result of the temperature detector 120. With this configuration, the upper limit of the output power values of the laser beams can be appropriately set within the dimmable range based on the detected temperature.

The light source device 11 changes the ratio in the output power between the plurality of laser beams based on the detection result of the temperature detector 120. With this configuration, an appropriate dimming can be performed based on the detected temperature.

The plurality of laser beams includes laser beams having a red component, a green component, and a blue component, respectively. The light source device 11 is configured to control the ratio in output power between the plurality of laser beams so as to maintain a constant white balance. With this configuration, the upper limit of the output power values of the plurality of laser beams can be appropriately set within the range in which the white balance can be maintained constant.

The light source device 11 includes a photodetector 119 that detects the output power of a bundle of the laser beams, and controls the output power of the bundle of the laser beams based on the detection result of the photodetector 119. With this configuration, the dimming is appropriately performed based on the detected light output power.

In addition, the light source device 11 according to an embodiment of the present disclosure includes the temperature detector 120 that detects a temperature and changes the maximum output power of the laser beams based on the detection result of the temperature detector 120. With this configuration, the maximum output power of the laser beams can be appropriately set based on the detected temperature.

The display device, the display system, and the mobile object according to the embodiment of the disclosure have been described above. However, the disclosure is not limited to the embodiment described above, and the embodiment may be modified within a scope conceivable by a person having ordinary skill in the art.

The display device according to the embodiment of the disclosure is not limited to a HUD device, and may be, for example, a head mount display device, a prompter device, a projector device, or the like. For example, when the display device according to an embodiment of the present disclosure is applied to a projector device, such a projection device may be configured in a similar manner to the display device 10. In other words, the display device 10 may project the image light onto, for example, a projection screen or a wall through the free-form surface mirror 30. The display device 10 may project the image light that has passed through the screen 15 onto, for example, a projection screen or a wall, without involving the free-form surface mirror 30.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), DSP (digital signal processor), FPGA (field programmable gate array) and conventional circuit components arranged to perform the recited functions.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. An optical scanner, comprising:
a plurality of light sources configured to output a plurality of laser beams of different color components, a ratio in maximum output power between the plurality of laser beams output from the plurality of light sources being variable;
an output power detector configured to detect output power of a bundle of the plurality of laser beams; and
a light deflector configured to deflect light emitted from the plurality of light sources to scan in a first scanning direction and a second scanning direction, the second scanning direction being orthogonal to the first scanning direction,
wherein the output power of the bundle of the plurality of laser beams is variable based on a detection result of the output power detector.

2. The optical scanner according to claim 1, further comprising a temperature detector configured to detect a temperature,
wherein the ratio in maximum output power between the plurality of laser beams output from the plurality of light sources is variable based on a detection result of the temperature detector.

3. The optical scanner according to claim 2,
wherein a ratio in output power between the plurality of laser beams output from the plurality of light sources is variable based on the detection result of the temperature detector.

4. The optical scanner according to claim 1,
wherein the plurality of laser beams includes a laser beam of a red component, a laser beam of a green component, and a laser beam of a blue component, and
wherein a ratio in output power between the plurality of laser beams is variable so as to maintain white balance constant.

5. The optical scanner according to claim 1, wherein the ratio in maximum output power between the plurality of laser beams output from the plurality of light sources changes according to a control signal output from processing circuitry,
wherein the processing circuitry determines the ratio in maximum output power so as to maintain white balance constant.

6. The optical scanner according to claim 1, further comprising processing circuitry configured to control the plurality of light sources to emit light based on image data and control the light deflector to form an image with the light based on the image data within an image area of a scanning range to be irradiated with the light which has been scanned,
wherein the processing circuitry is configured to control the output power of the plurality of laser beams so as to change the ratio in maximum output power between the plurality of laser beams.

7. The optical scanner according to claim 6, further comprising a screen to be scanned with the scanning light by the light deflector,
wherein the image area on which the image is formed is on the screen.

8. A display system comprising:
the optical scanner according to claim 1;
an image forming optical system; and
a reflector,
the image forming optical system configured to reflect the light projected from a screen toward the reflector, and the reflector configured to reflect the light reflected by the image forming optical system so as to form a virtual image.

9. A mobile object comprising the display system according to claim 8,
wherein the reflector is a windshield.

* * * * *